United States Patent
Hamada et al.

(10) Patent No.: US 8,064,529 B2
(45) Date of Patent: Nov. 22, 2011

(54) PEAK SUPPRESSOR

(75) Inventors: Hajime Hamada, Kawasaki (JP); Kazuo Nagatani, Kawasaki (JP); Hiroyoshi Ishikawa, Kawasaki (JP); Nobukazu Fudaba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 737 days.

(21) Appl. No.: 11/878,588

(22) Filed: Jul. 25, 2007

(65) Prior Publication Data
US 2008/0043869 A1 Feb. 21, 2008

(30) Foreign Application Priority Data

Aug. 17, 2006 (JP) .................................. 2006-222337

(51) Int. Cl.
*H04K 1/10* (2006.01)
*H04L 27/28* (2006.01)

(52) U.S. Cl. ...................................................... 375/260

(58) Field of Classification Search .................. 375/200, 375/240, 259, 260, 261, 285, 295, 296, 298; 455/69, 114.1, 115.1, 116, 117, 127.1, 127.2, 455/522
See application file for complete search history.

(56) References Cited

U.S. PATENT DOCUMENTS

| | | | | |
|---|---|---|---|---|
| 6,009,090 A * | 12/1999 | Oishi et al. | ..................... | 370/342 |
| 6,701,163 B1 * | 3/2004 | Hiramatsu | ..................... | 455/561 |
| 6,982,965 B2 * | 1/2006 | Itahara et al. | ................. | 370/317 |
| 6,985,539 B2 * | 1/2006 | Kaku et al. | ..................... | 375/297 |
| 7,046,739 B2 | 5/2006 | Pilcher | | |
| 7,580,476 B2 | 8/2009 | Robinson et al. | | |
| 2002/0172296 A1 * | 11/2002 | Pilcher | ........................ | 375/296 |
| 2003/0012292 A1 * | 1/2003 | Hunton | ........................ | 375/295 |
| 2004/0090283 A1 * | 5/2004 | Naito | ........................... | 333/17.2 |
| 2004/0136395 A1 * | 7/2004 | Itahara et al. | ................. | 370/441 |
| 2005/0243909 A1 * | 11/2005 | Itahara et al. | ................. | 375/240 |
| 2006/0046764 A1 * | 3/2006 | Ohba et al. | .................... | 455/522 |
| 2009/0245226 A1 | 10/2009 | Robinson et al. | | |

FOREIGN PATENT DOCUMENTS

| | | |
|---|---|---|
| EP | 1 387 541 | 2/2004 |
| JP | 7-245574 A | 9/1995 |
| JP | 2004-166245 | 6/2004 |
| JP | 2005-020697 A | 1/2005 |

OTHER PUBLICATIONS

"Extended European Search Report", mailed by EPO and corresponding to European application No. EP 07 11 3465.4 on Aug. 31, 2010.
Yadavelli, Kasyap et al., "Crest factor reduction engine for multi-carrier WCDMA transmitted signals", Sep. 5, 2004.
"Japanese Office Action", mailed by JPO and corresponding to Japanese application No. 2006-222337 on Apr. 12, 2011, with partial English translation.

* cited by examiner

*Primary Examiner* — Dac Ha
*Assistant Examiner* — Syed Haider
(74) *Attorney, Agent, or Firm* — Fujitsu Patent Center

(57) ABSTRACT

In a configuration where systems C and D having different reception quality requirements are present, a peak suppressor generates a replica of a signal from system C combined together with a signal from system D before peak suppression. Based on the replica, system specific peak suppressing units respectively perform peak suppression on signals of each system according to the respective reception quality requirements of each system. A combining unit combines the peak-suppressed signals of each system. Hence, peak suppression on signals from systems requiring different reception qualities is performed at an appropriate degree according to each system.

14 Claims, 9 Drawing Sheets

PEAK SUPPRESSOR

CROSS-REFERENCE TO RELATED APPLICATIONS

This application is based upon and claims the benefit of priority from the prior Japanese Patent Application No. 2006-222337, filed on Aug. 17, 2006, the entire contents of which are incorporated herein by reference.

BACKGROUND OF THE INVENTION

1. Field of the Invention

The present invention relates to a peak suppressor and more particularly to a peak suppressor built in a wireless transmitter.

2. Description of the Related Art

In the field of wireless digital communication, a technology to improve transmission amplifier efficiency involving peak suppression of a transmission target signal prior to amplification by a transmission amplifier is conventionally known. When a peak-to-average power ratio (PAPR) of an input signal to the transmission amplifier is reduced by peak suppression, output back-off of the transmission amplifier decreases, and amplifier efficiency improves.

FIG. 15 is a graph illustrating the relationship between input/output characteristics of the transmission amplifier and the peak of each signal. As shown in FIG. 15, the signal in the lower portion of the figure having an operating point A as an average power has a large back-off, and hence efficiency of the transmission amplifier is reduced. On the other hand, the signal in the upper portion of the figure is obtained by clipping a signal that has an operating point B as an average power, a waveform similar to that of the signal in the lower portion of the figure and a power larger than a given power, i.e., it is a signal subjected to peak suppression. Since the PAPR of the signal is reduced by peak suppression in this manner, the back-off is restrained, thereby enhancing the efficiency of the transmission amplifier. Various peak suppression modes have been proposed.

FIG. 16 is a block diagram of a wireless transmitter having a conventional clipping mode peak suppressor. As shown in FIG. 16, a conventional clipping mode peak suppressor 1 has an amplitude calculator 2, a comparator 3, a suppression coefficient calculator 4, a selector 5, a delay unit 6, and a multiplier 7. The amplitude calculator 2 calculates an amplitude of a transmission target signal generated by a digital signal generator 8. If i and q respectively represent amplitudes of a signal i and a signal q of the transmission target signal, then an amplitude of the transmission target signal is obtained based on $[\sqrt{(i^2+q^2)}]$. The comparator 3 compares the amplitude obtained by the amplitude calculator 2 with a preset threshold value Vth.

The suppression coefficient calculator 4 calculates $[Vth/\sqrt{i^2+q^2}]$ as a value required to suppress a peak of the transmission target signal. The selector 5 selects a suppression coefficient based on a result of the comparison by the comparator 3. The selector 5 selects the value obtained by the suppression coefficient calculator 4 if the amplitude obtained by the amplitude calculator 2 is larger than the threshold value Vth $[Vth/\sqrt{(i^2+q^2)}>Vth]$, and selects 1 if not. The delay unit 6 delays the transmission target signal for a period equivalent to the time required from amplitude calculation of the transmission target signal generated by the digital signal generator 8 to selection of the suppression coefficient.

The multiplier 7 multiplies the transmission target signal output from the delay unit 6 by the suppression coefficient selected by the selector 5. Therefore, the peak suppressor 1 outputs a peak suppressed transmission target signal when the amplitude obtained by the amplitude calculator 2 is larger than the threshold value Vth, and outputs the transmission target signal as it is when not. A digital/analog (D/A) converter 9 converts the transmission target signal output from the peak suppressor 1 into an analog signal, a mixer 10 multiplies the analog signal by a local carrier wave from a local oscillator 11, and a resulting signal is input to a transmission amplifier 12. The signal amplified by the transmission amplifier 12 is transmitted via an antenna 13.

FIG. 17 is a block diagram of a wireless transmitter having a conventional windowing function mode peak suppressor. As shown in FIG. 17, a windowing function mode peak suppressor 16 has a windowing function generator 17 between the suppression coefficient calculator 4 and the selector 5 in the peak suppressor 1 depicted in FIG. 16. That is, the peak suppressor 16 is configured to apply a windowing function generated by the windowing function generator 17 to a value obtained by the suppression coefficient calculator 4. Peak suppression distorts a signal in both the clipping mode and the windowing function mode, thereby leading to deterioration in reception quality. That is, a reduction in the PAPR due to peak suppression and the reception quality have a trade-off relationship. Therefore, the degree of peak suppression must be determined so as to satisfy the reception quality set for each system.

A transmitter that controls for signal level adjustment of a multi-carrier signal obtained by combining multiple carriers is known. This transmitter includes a peak suppressing unit that detects the presence/absence of a peak based on a sum of the power levels of respective input carriers and outputs carriers obtained by suppressing power levels of respective carriers so as to reduce the total power level below a predetermined peak threshold value when a peak is detected. The transmitter further includes an input power calculator that calculates an average power level with respect to the respective carriers before input to the peak suppressing unit and an output power calculator that calculates an average power level with respect to the respective carriers after output from the peak suppressing unit; a monitoring unit that outputs level control information required to control signal levels of respective carriers output from the peak suppressor based on the average power level calculated by the input power calculator and the average power level calculated by the output power calculator; and a level adjusting unit that adjusts the levels of respective carriers based on corresponding level control information. For an example of such a transmitter, refer to Japanese Patent Application Laid-open No. 2004-166245, claim 3, paragraph 0025.

However, the aforementioned conventional peak suppression technologies are all technologies for suppressing signal peak in a single system, and do not perform system specific signal peak suppression for multiple systems where each system has a different required reception quality. The Japanese Patent Application Laid-open No. 2004-166245 does not clearly explain or suggest that peak suppression is performed for multiple systems specific to the different reception quality requirements of each system.

Therefore, a problem arises with the conventional technologies when the same frequency band is used to perform services in systems. For example, under the Third Generation Partnership Project (3GPP), standardization of a 3GPP long-term evolution system (LTE system) is currently in progress.

The LTE system uses the same frequency band as that in widely prevalent third-generation (3G) systems. Therefore, both the LTE system and the 3G system coexist in the same frequency band at the start of a service of the LTE system. In such a case, provision of separate transmission amplifiers for each of the systems, the LTE system and the 3G system, in a transmitter is inefficient. Accordingly, a configuration where a common transmission amplifier is provided for both of the systems and signals of both of the systems are input to the transmission amplifier in a multi-carrier combined state is desirable.

However, the LTE system and the 3G system have defined reception qualities that are different from each other. Therefore, similar to the conventional technologies, by a configuration in which peak suppression is performed on a combined multi-carrier signal obtained by combining the signals of both systems and the resulting signal is input to the transmission amplifier, peak suppression is performed in compliance with the system having a higher required reception quality, i.e., the LTE system. Accordingly, weak peak suppression is effected with respect to the system having a lower required reception quality, i.e., the 3G system, resulting in a problem that PAPR cannot be sufficiently reduced.

To at least solve the above problems in the conventional technologies, it is an object of the present invention to provide a peak suppressor that can perform an appropriate degree of peak suppression on signals of multiple systems according to differing reception quality requirements of each system.

SUMMARY OF THE INVENTION

It is an object of the present invention to at least solve the above problems in the conventional technologies.

A peak suppressor according to one aspect of the present invention includes peak suppressing units that perform peak suppression on signals of multiple systems and output suppressed signals, wherein the peak suppression is performed based on requirements that differ according to system. The peak suppressor also includes a combining unit that combines the suppressed signals.

A peak suppressor according to another aspect of the present invention that includes at least one peak suppressing unit that performs peak suppression on a portion of the signals of multiple systems and outputs a suppressed signal, wherein the peak suppression is performed based on requirements that differ according to system. The peak suppressor also includes a combining unit that combines the suppressed signal with a signal that is not subjected to peak suppression.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Figure 1:
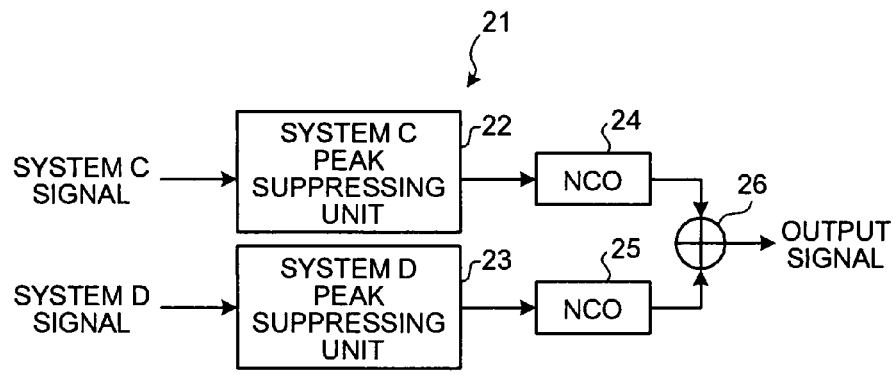
FIG. 1 is a block diagram of a peak suppressor according to a first embodiment of the present invention.

Referring to the accompanying drawings, exemplary embodiments according to the present invention are explained in detail below. Although not particularly restricted hereto, two systems, such as a system C and a system D, require different reception qualities. Furthermore, like reference numerals denote like structures in the following explanation and redundant explanations are omitted.

FIG. 1 is a block diagram of a peak suppressor according to a first embodiment of the present invention. As shown in FIG. 1, a peak suppressor 21 has a system C peak suppressing unit 22, a system D peak suppressing unit 23, a system C numerical control oscillator (NCO) 24, a system D numerical control oscillator (NCO) 25, and a combining unit 26.

The system C peak suppressing unit 22 performs peak suppression processing with respect to a transmission target signal for the system C (hereinafter, "system C signal") output from a system C digital signal generator (not depicted) such that a reception quality required in the system C is satisfied. The system C NCO 24 performs complex multiplication of a sine wave and a cosine wave with respect to a signal (a signal i and a signal q) output from the system C peak suppressing unit 22 and generates a transmission signal of the system C signal.

The system D peak suppressing unit 23 performs peak suppression processing with respect to a system D transmission target signal (hereinafter, "system D signal") output from a system D digital signal generator (not depicted) such that a reception quality required in the system D is satisfied. The system D NCO 25 carries out complex multiplication of a sine wave and a cosine wave with respect to a signal (a signal i and a signal q) output from the system D peak suppressing unit 23 and generates a transmission signal of the system D signal.

Figure 16:
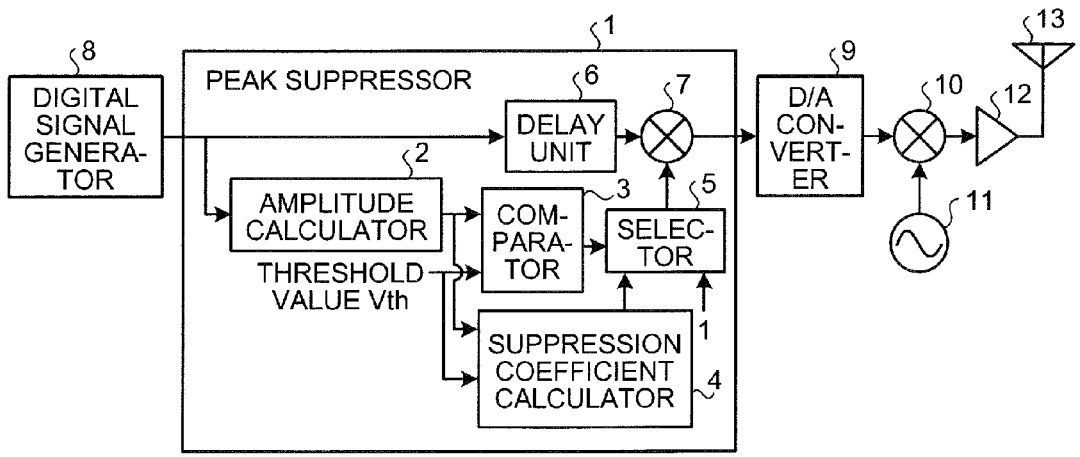
FIG. 16 is a block diagram of a wireless transmitter having a conventional clipping mode peak suppressor.
Figure 17:
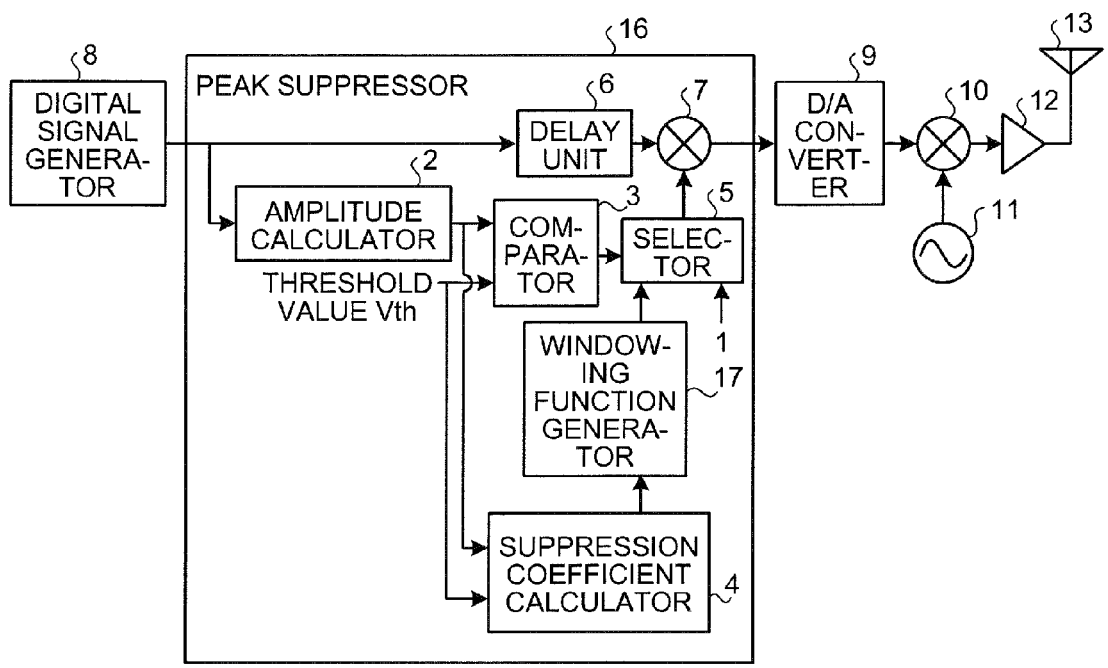
FIG. 17 is a block diagram of a wireless transmitter having a conventional windowing function mode peak suppressor.

Although not restricted particularly hereto, the system C peak suppressing unit 22 or the system D peak suppressing unit 23, for example, has the same configuration as a conventional clipping mode peak suppressor (see FIG. 16), a conventional windowing function mode peak suppressor (see FIG. 17), or a conventional peak suppressor adopting any other mode. The combining unit 26 combines (adds) the transmission signal of the system C signal output from the system C NCO 24 with the transmission signal of the system D signal output from the system D NCO 25.

Operation of the peak suppressor 21 is explained. The system C signal is output from the system C digital signal generator (not depicted), and input to the system C peak suppressing unit 22. The system C peak suppressing unit 22 suppresses a peak of the system C signal so as to satisfy the reception quality required in the system C. On the other hand, the system D signal is output from the system D digital signal generator (not depicted), and input to the system D peak suppressing unit 23. The system D peak suppressing unit 23 suppresses a peak of the system D signal so as to satisfy the reception quality required in the system D.

The system C NCO 24 and the system D NCO 25 respectively convert the system C signal and the system D signal subjected to peak suppression into transmission signals, and the combining unit 26 combines the converted transmission signals with each other. A digital/analog converter (not depicted) converts the combined transmission signal into an analog signal. A multiplier (not depicted) multiplies the analog signal by an oscillation signal from a local oscillator (not depicted), a transmission amplifier (not depicted) amplifies the multiplied signal, and the resulting signal is transmitted from an antenna (not depicted).

According to the first embodiment, since the peak of the system C signal is suppressed based on the reception quality required in the system C and the peak of the system D signal is suppressed based on the reception quality required in the system D, an appropriate degree of peak suppression can be effected with respect to the different reception qualities required for each of the systems. Combination of the respective transmission signals after peak suppression enables a multi-carrier signal that includes signals specific to the different reception qualities required in each system to be transmitted by a single transmission amplifier.

The peak suppressor 21 according to the first embodiment is effective when signals subjected to peak suppression for each of the systems are combined with each other and further peak suppression of the combined transmission signal is not required, i.e., when the PAPR of the combined transmission signal is sufficiently small. However, if a peak requiring suppression is generated through the combining of the signals of the respective systems, the peak suppressor 21 according to the first embodiment cannot suppress this peak. Therefore, in such a case, the following configurations according to a second to a fourth embodiment are desirable.

Figure 2:
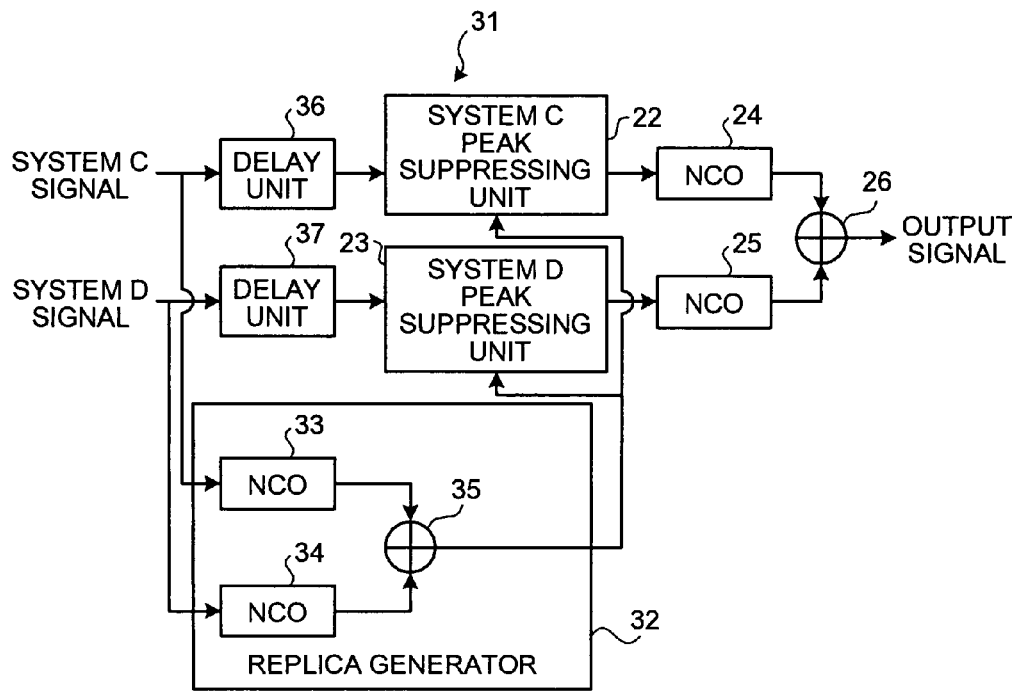
FIG. 2 is a block diagram of a peak suppressor according to a second embodiment of the present invention.

FIG. 2 is a block diagram of a peak suppressor according to the second embodiment of the present invention. As shown in FIG. 2, a peak suppressor 31 according to the second embodiment has a replica generator 32 and two delay units 36 and 37 added to the configuration according to the first embodiment. Other structures are the same as those in the first embodiment. The replica generator 32 has a system C replica numerical control oscillator (NCO) 33, a system D replica numerical control oscillator (NCO) 34, and a combining unit 35.

The system C replica NCO 33 performs complex multiplication of a sine wave and a cosine wave with respect to the system C signal (the signal i and the signal q) output from the system C digital signal generator (not depicted) to generate a replica of the system C signal before peak suppression. Likewise, the system D replica NCO 34 generates a replica of the system D signal before peak suppression, the system D signal being output from the system D digital signal generator (not depicted). The combining unit 35 combines (adds) the replica of the system C signal output from the system C replica NCO 33 with the replica of the system D signal output from the system D replica NCO 34. This combined replica is referred to as a combined signal replica.

The combined signal replica is supplied to the system C peak suppressing unit 22 and the system D peak suppressing unit 23. The delay unit 36 delays input of the system C signal to the system C peak suppressing unit 22 for a period equivalent to the time required to generate the combined signal replica by the replica generator 32 and identify a peak position of this replica. The delay unit 37 delays input of the system D signal to the system D peak suppressing unit 23 for a period equivalent to the time required to generate the combined signal replica by the replica generator 32. The system C peak suppressing unit 22 and the system D peak suppressing unit 23 suppress peaks of the system C signal and the system D signal respectively, based on the combined signal replica.

A difference in operation between the peak suppressor 31 and the first embodiment is explained. The system C signal output from the system C digital signal generator (not depicted) is input to the replica generator 32, and also input to the system C peak suppressing unit 22 with time delay by the delay unit 36 equivalent to the time required for generation of the combined signal replica. On the other hand, the system D signal output from the system D digital signal generator (not depicted) is input to the replica generator 32, and also input to the system D peak suppressing unit 23 with a time delay by the delay unit 37 equivalent to the time required for generation of the combined signal replica.

The replica generator 32 generates the combined signal replica, and supplies the generated replica to the system C peak suppressing unit 22 and the system D peak suppressing unit 23. The system C peak suppressing unit 22 and the system D peak suppressing unit 23 respectively suppress peaks of the system C signal and the system D signal in such a manner that a peak value of the combined signal replica does not exceed a desired value.

Figure 3:
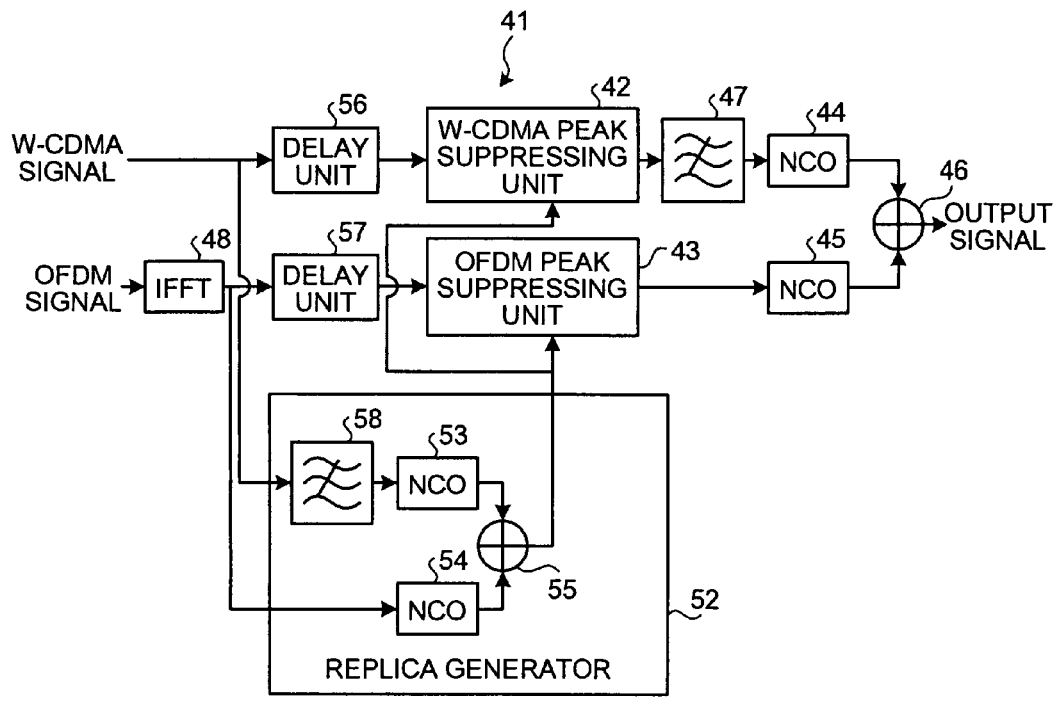
FIG. 3 is a block diagram of a specific example of the peak suppressor according to the second embodiment of the present invention.

FIG. 3 is a block diagram of a specific example of the peak suppressor according to the second embodiment of the present invention. As shown in FIG. 3, a peak suppressor 41 according to this specific example is used in an environment where both a 3G system and an LTE system are present as systems requiring different reception qualities. The 3G system adopts a W-CDMA mode. The LTE system uses an OFDM mode.

The peak suppressor 41 has a W-CDMA peak suppressing unit 42, an OFDM peak suppressing unit 43, a W-CDMA numerical control oscillator (NCO) 44, an OFDM numerical control oscillator (NCO) 45, a combining unit 46, a low-pass filter 47, an inverse fast Fourier transformer (IFFT) 48, two delay units 56 and 57, and a replica generator 52. The W-CDMA peak suppressing unit 42, the OFDM peak suppressing unit 43, the W-CDMA NCO 44, the OFDM NCO 45, the combining unit 46, the delay unit 56, and the delay unit 57 correspond to the system C peak suppressing unit 22, the system D peak suppressing unit 23, the system C NCO 24, the system D NCO 25, the combining unit 26, the delay unit 36, and the delay unit 37 in the peak suppressor 31 depicted in FIG. 2, respectively.

The low-pass filter 47 is provided between the W-CDMA peak suppressing unit 42 and the W-CDMA NCO 44, and removes an out-of-band component in an output signal from the W-CDMA peak suppressing unit 42. The IFFT 48 performs inverse fast Fourier transformation with respect to an OFDM transmission target signal (hereinafter, "OFDM signal") output from an OFDM digital signal generator (not depicted). The output signal from the IFFT 48 is supplied to the delay unit 57 and the replica generator 52.

The replica generator 52 has a W-CDMA replica numerical control oscillator (NCO) 53, an OFDM replica numerical control oscillator (NCO) 54, a combining unit 55, and a low-pass filter 58. The W-CDMA replica NCO 53, the OFDM replica NCO 54, and the combining unit 55 respectively correspond to the system C replica NCO 33, the system D replica NCO 34, and the combining unit 35 in the replica generator 32 depicted in FIG. 2.

The low-pass filter 58 removes an out-of-band component in a W-CDMA transmission target signal (hereinafter, "W-CDMA signal") output from a W-CDMA digital signal generator (not depicted). The W-CDMA signal transmitted through the low-pass filter 58 is supplied to the W-CDMA replica NCO 53. The OFDM replica NCO 54 receives an output signal from the IFFT 48.

Figure 4:
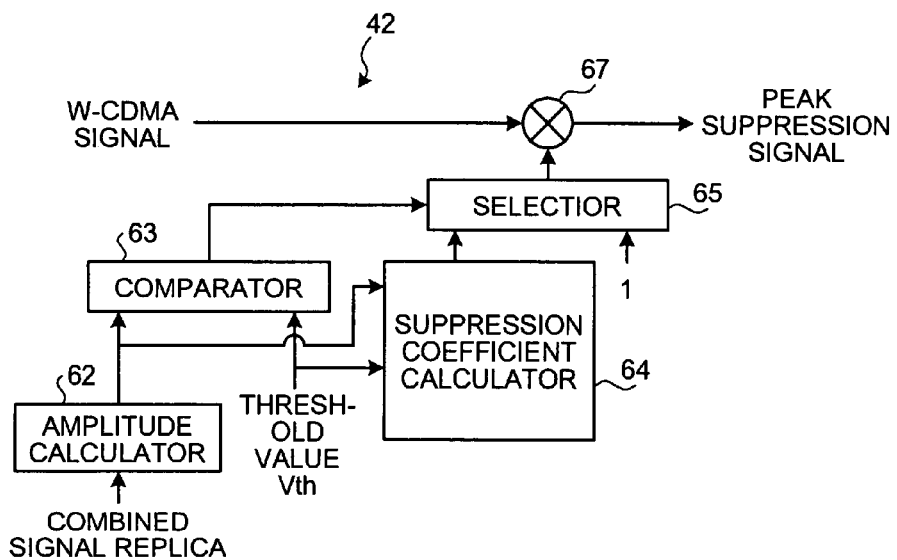
FIG. 4 is a block diagram of an example of a wideband code division multiple access (W-CDMA) peak suppressing unit in a peak suppressor according to the second embodiment of the present invention.

FIG. 4 is a block diagram of an example of the W-CDMA peak suppressing unit depicted in FIG. 3. As shown in FIG. 4, the W-CDMA peak suppressing unit 42 has an amplitude calculator 62, a comparator 63, a suppression coefficient calculator 64, a selector 65, and a multiplier 67. The amplitude calculator 62 calculates an amplitude of a combined signal replica output from the replica generator 52. An amplitude of the combined signal replica can be obtained based on an expression $[\sqrt{(i^2+q^2)}]$, where i and q represent amplitudes of the signal i and the signal q in the combined signal replica. The comparator 63 compares the amplitude obtained by the amplitude calculator 62 with a preset threshold value Vth.

The suppression coefficient calculator 64 calculates $[Vth/\sqrt{(i^2+q^2)}]$ as a value required to suppress a peak of the W-CDMA signal. As a suppression coefficient, the selector 65 selects the value obtained by the suppression coefficient calculator 64 if the amplitude obtained by the amplitude calculator 62 is larger than the threshold value Vth $[Vth/\sqrt{(i^2+q^2)}>Vth]$, and selects 1 if not. The multiplier 67 multiplies the W-CDMA signal output from the delay unit 56 by the suppression coefficient selected by the selector 65, and outputs the result of the multiplication as a peak suppression signal.

Therefore, the W-CDMA peak suppressing unit 42 outputs a peak suppressed W-CDMA signal when the amplitude of the combined signal replica is larger than the threshold value Vth, and outputs the W-CDMA signal as it is when not. Further, the configuration of the W-CDMA peak suppressing unit 42 is not restricted to that depicted in FIG. 4, and may be, for example, a configuration adopting the windowing function mode (see FIG. 17) or a configuration using any other mode.

Figure 5:
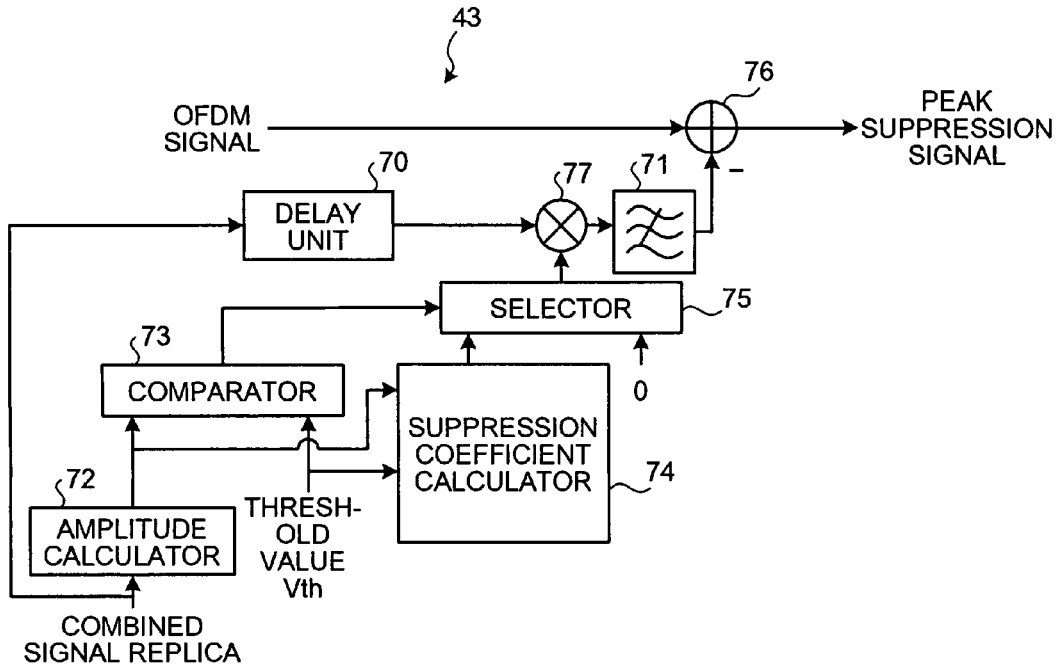
FIG. 5 is a block diagram of an example of an orthogonal frequency division multiple access (OFDM) peak suppressing unit in the peak suppressor according to the second embodiment of the present invention.
Figure 6:
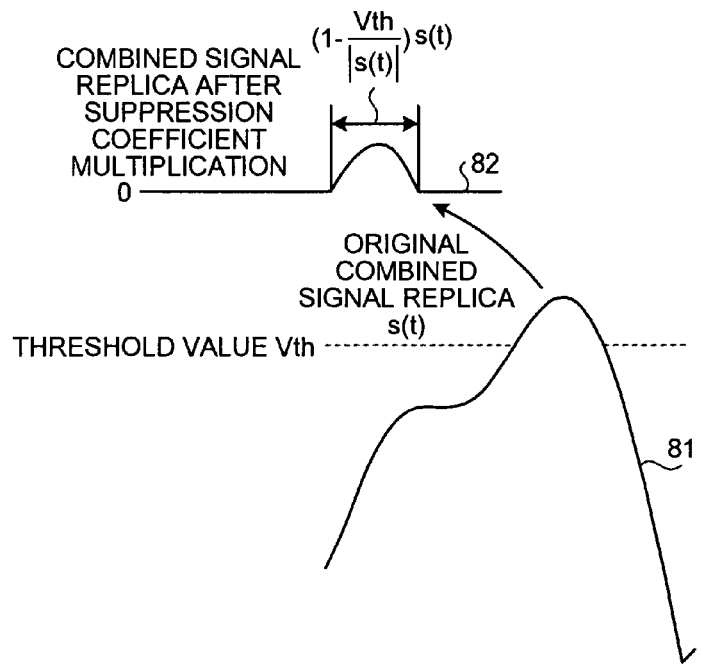
FIG. 6 is a schematic view for explaining the OFDM peak suppressing unit depicted in FIG. 5.

FIG. 5 is a block diagram of an example of the OFDM peak suppressing unit depicted in FIG. 3. FIG. 6 is a schematic view illustrating the OFDM peak suppressing unit depicted in FIG. 5. As shown in FIG. 5, the OFDM peak suppressing unit 43 has a delay unit 70, a low-pass filter 71, an amplitude calculator 72, a comparator 73, a suppression coefficient calculator 74, a selector 75, a subtracter 76, and a multiplier 77. The amplitude calculator 72 performs the same calculation as that effected by the amplitude calculator 62 in the W-CDMA peak suppressing unit 42, thereby obtaining an amplitude $([\sqrt{i^2+q^2}])$ of the combined signal replica output from the replica generator 52.

The comparator 73 compares the amplitude obtained by the amplitude calculator 72 with a preset threshold value Vth. The suppression coefficient calculator 74 calculates $[1-Vth/\sqrt{(i^2+q^2)}]$ as a value required to suppress a peak of the OFDM signal. As a suppression coefficient, the selector 75 selects the value obtained by the suppression coefficient calculator 74 if the amplitude obtained by the amplitude calculator 72 is larger than the threshold value Vth $[Vth/\sqrt{i^2+q^2})>Vth]$, and selects 0 if not.

The multiplier 77 multiplies the combined signal replica that is output from the replica generator 52 and delayed for a given period of time by the delay unit 70, by the suppression coefficient selected by the selector 75. Consequently, as shown in FIG. 6, a part before multiplication of the suppression coefficient, i.e., a part exceeding an original combined signal replica 81 alone is extracted, resulting in acquisition of a signal 82 in which a part that does not exceed the threshold value Vth of the original combined signal replica 81 becomes 0.

The delay unit 70 delays the combined signal replica for a period equivalent to the time required to select the suppression coefficient. The low-pass filter 71 limits a band of the signal output from the multiplier 77 on a time basis to remove an out-of-band component. The subtracter 76 subtracts a signal transmitted through the low-pass filter 71 from the OFDM signal transmitted through the delay unit 57, and outputs the result of this subtraction as a peak suppression signal.

Therefore, the OFDM peak suppressing unit 43 outputs a peak suppressed OFDM signal when the amplitude of the combined signal replica is larger than the threshold value Vth, and outputs the OFDM signal as it is when not. Furthermore, the configuration of the OFDM peak suppressing unit 43 is not restricted to that depicted in FIG. 5, and may be, for example, a configuration adopting the clipping mode equivalent to that of the W-CDMA peak suppressing unit 42, a configuration adopting the windowing function mode (see FIG. 17), or a configuration using any other mode.

Figure 7:
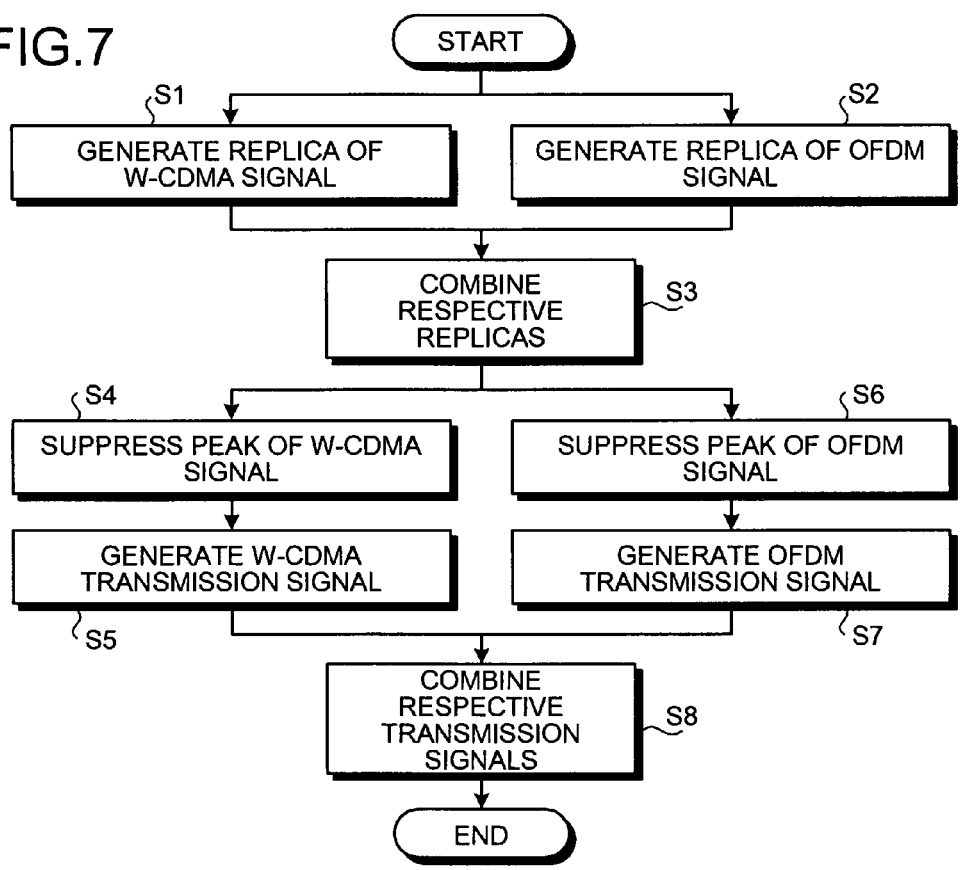
FIG. 7 is a flowchart for explaining an operation of the peak suppressor depicted in FIG. 3.

Operation of the peak suppressor 41 is explained. FIG. 7 is a flowchart illustrating operation of the peak suppressor depicted in FIG. 3. As shown in FIG. 7, first, the replica generator 52 generates a replica of the W-CDMA signal and a replica of the OFDM signal (steps S1 and S2), and combines the respective replicas with each other to form a combined signal replica (step S3).

Then, the W-CDMA peak suppressing unit 42 suppresses a peak of the W-CDMA signal based on the combined signal replica (step S4), and the W-CDMA NCO 44 generates a W-CDMA transmission signal (step S5). At the same time, the OFDM peak suppressing unit 43 suppresses a peak of the OFDM signal based on the combined signal replica (step S6), and the OFDM NCO 45 generates an OFDM transmission signal (step S7). Subsequently, the combining unit 46 combines the respective transmission signals with each other to generate a multi-carrier transmission signal (step S8).

Figure 8:
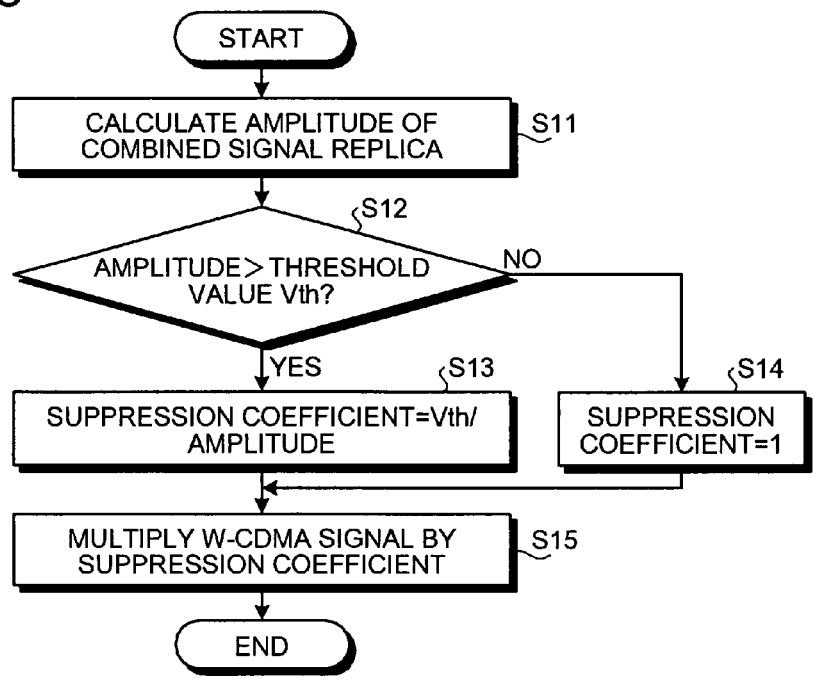
FIG. 8 is a flowchart for explaining an operation of the W-CDMA peak suppressing unit depicted in FIG. 4.

FIG. 8 is a flowchart illustrating operation of the W-CDMA peak suppressing unit depicted in FIG. 4. As shown in FIG. 8, in the W-CDMA peak suppressing unit 42, first, the amplitude calculator 62 calculates an amplitude of the combined signal replica (step S11). Then, the comparator 63 compares the amplitude of the combined signal replica with the threshold value Vth (step S12).

If [amplitude>threshold value Vth] is achieved as a result of comparison (step S12: YES), the selector 65 selects [Vth/amplitude] and determines [suppression coefficient=Vth/amplitude] (step S13). On the other hand, if [amplitude>threshold value Vth] is not attained (step S12:

NO), the selector 65 selects 1 and determines [suppression coefficient=1] (step S14). Subsequently, the multiplier 67 multiplies the W-CDMA signal by the suppression coefficient selected at the step S13 or S14 to acquire a W-CDMA peak suppression signal (step S15).

Figure 9:
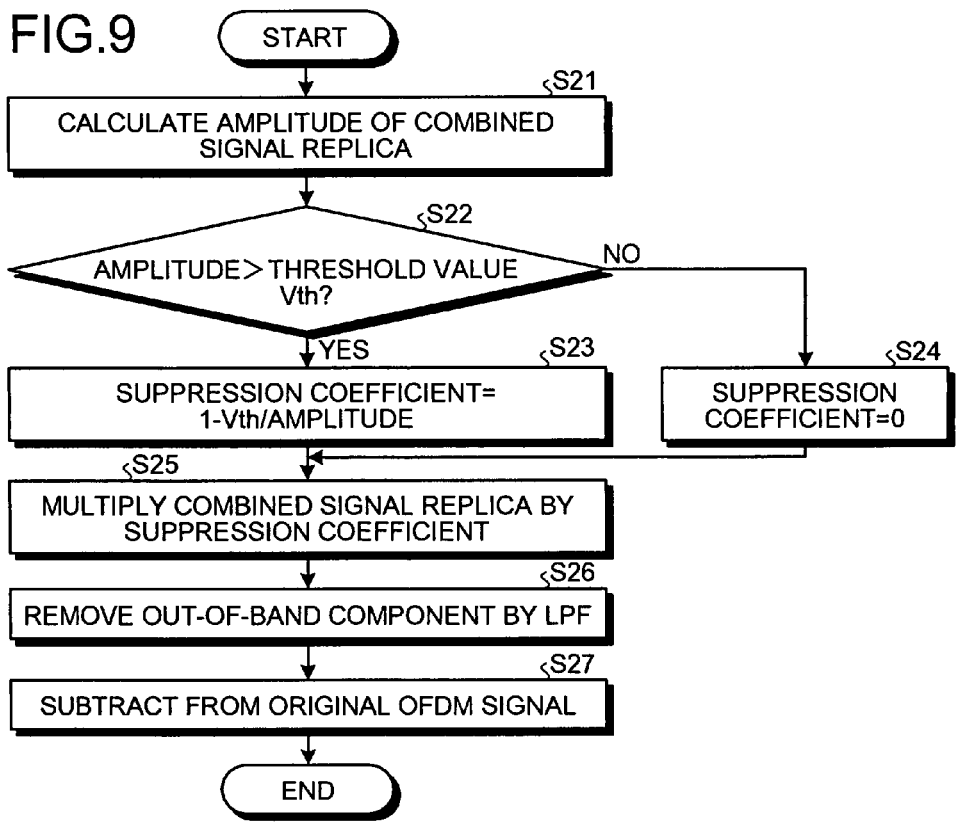
FIG. 9 is a flowchart for explaining an operation of the OFDM peak suppressing unit depicted in FIG. 5.

FIG. 9 is a flowchart illustrating operation of the OFDM peak suppressing unit depicted in FIG. 5. As shown in FIG. 9, in the OFDM peak suppressing unit 43, first, the amplitude calculator 72 calculates an amplitude of the combined signal replica (step S21). Then, the comparator 73 compares the amplitude of the combined signal replica with the threshold value Vth (step S22). When [amplitude>threshold value Vth] is achieved as a result of the comparison (step S22: YES), the selector 75 selects [1−Vth/amplitude] and determines [suppression coefficient=1−Vth/amplitude] (step S23).

On the other hand, when [amplitude>threshold value Vth] is not attained (the step S22: NO), the selector 75 selects 0 and determines [suppression coefficient=0] (step S24). Subsequently, the multiplier 77 multiplies the combined signal replica by the suppression coefficient selected at the step S23 or S24 (step S25), and the low-pass filter 71 removes an out-of-band component of the signal obtained by this multiplication (step S26). Then, the subtracter 76 subtracts a signal transmitted through the low-pass filter 71 from the original OFDM signal to acquire an OFDM peak suppression signal (a step S27).

Figure 10:
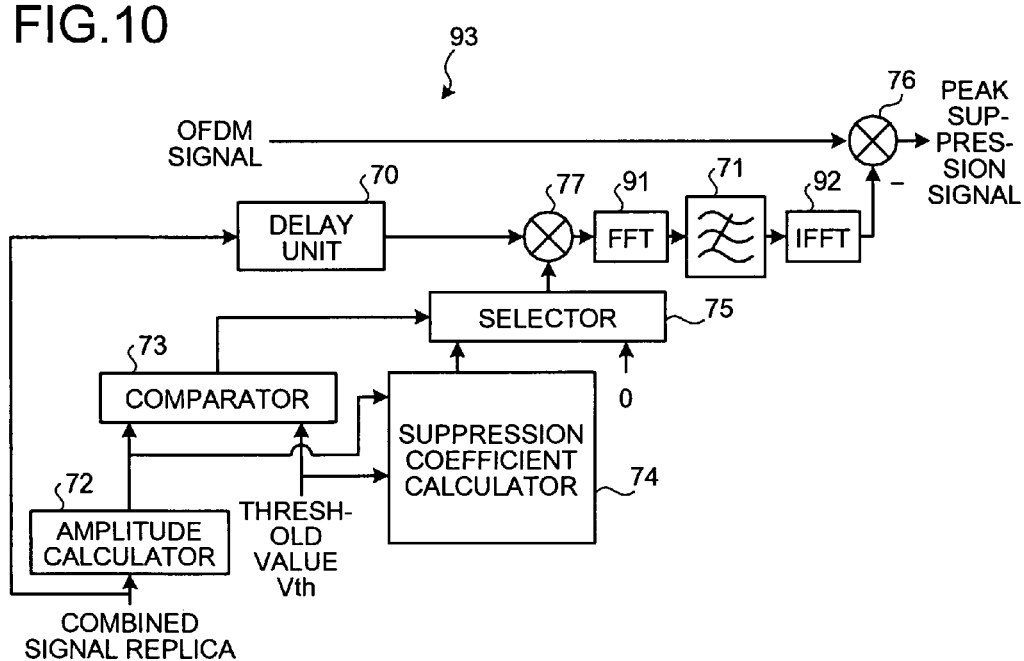
FIG. 10 is a block diagram of another example of an OFDM peak suppressing unit in the peak suppressor according to the second embodiment of the present invention.

Furthermore, the configuration of the OFDM peak suppressing unit may be a configuration depicted in FIG. 10. FIG. 10 is a block diagram of another example of the OFDM peak suppressing unit. As shown in FIG. 10, in the configuration of the OFDM peak suppressing unit 43 depicted in FIG. 5, an OFDM peak suppressing unit 93 has a fast Fourier transformer (FFT) 91 and an inverse fast Fourier transformer (IFFT) 92 between the multiplier 77 and the low-pass filter 71 and between the low-pass filter 71 and the subtracter 76, respectively. In the present OFDM peak suppressing unit 93, the low-pass filter 71 limits a band on a frequency basis.

According to the second embodiment, since replicas of signals from respective systems before peak suppression are generated and a combined signal replica obtained by combining the respective replicas is used to suppress the peaks of the signals from the respective systems, the peak suppression of the signals from the respective systems can be suppressed by an appropriate degree of peak suppression corresponding to each of the systems in such a manner that a peak generated through combination of the signals from each of the systems does not exceed a desired value. That is, an amplifier input signal after combining the transmission signals from the systems can be determined as a reference to suppress the peaks of the signals from the respective systems.

Figure 11:
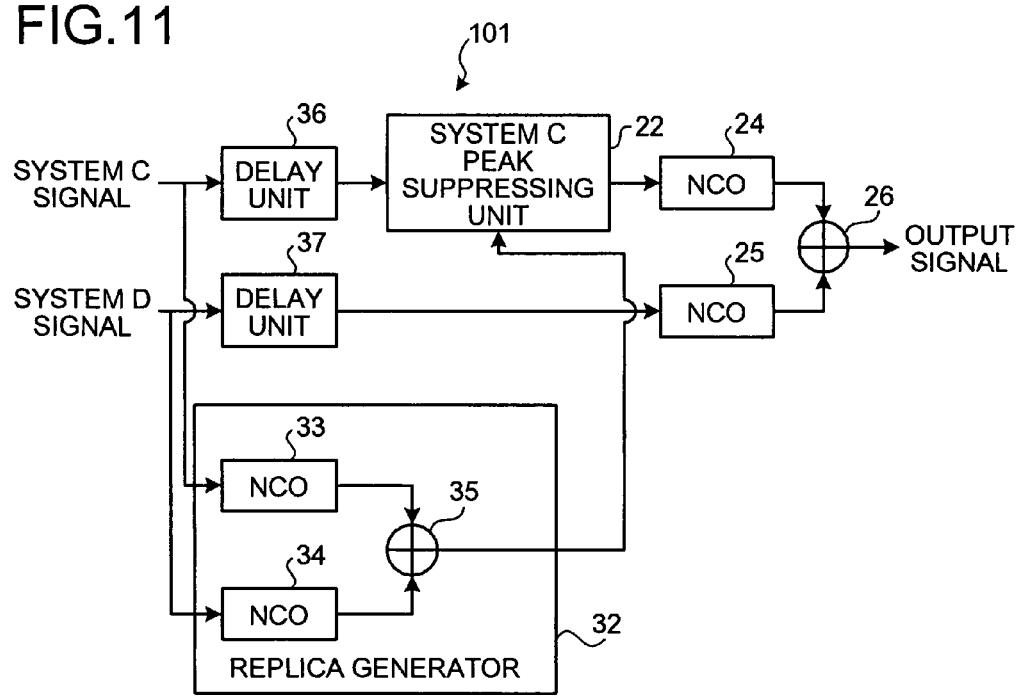
FIG. 11 is a block diagram of a peak suppressor according to a third embodiment of the present invention.

FIG. 11 is a block diagram of a peak suppressor according to the third embodiment of the present invention. As shown in FIG. 11, a peak suppressor 101 according to the third embodiment performs peak suppression with respect to the system C alone but does not effect peak suppression with respect to the system D. Other structures are the same as those in the second embodiment.

When required conditions of reception qualities are biased in multiple systems as in the third embodiment, application of peak suppression can be limited to signals from only some of the systems. In the example depicted in FIG. 10, reception quality is deteriorated in the system C to which peak suppression is applied. However, reception quality is not deteriorated in the system D to which peak suppression is not applied. Furthermore, the third embodiment can be also applied to the first embodiment.

Figure 12:
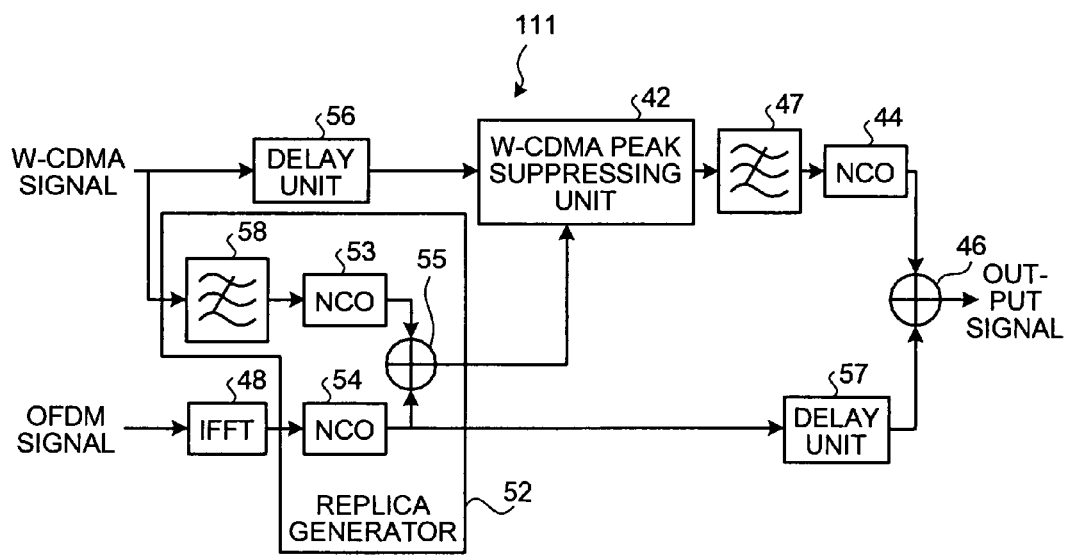
FIG. 12 is a block diagram of a specific example of the peak suppressor according to the third embodiment of the present invention.

FIG. 12 is a block diagram of a specific example of the peak suppressor according to the third embodiment of the present invention. As shown in FIG. 12, a peak suppressor 111 according to this specific example is used in an environment where both a 3G system and an LTE system are present as systems having different required reception qualities. The reception quality requirements of the LTE system are stricter than those of the 3G system. Thus, the peak suppressor 111 according to this example uses a combined signal replica to suppress a peak of a W-CDMA signal alone, and the combining unit 46 combines this signal with the original OFDM signal. Furthermore, in the example depicted in FIG. 12, the OFDM replica NCO 54 also serves as an OFDM numerical control oscillator, and hence the delay unit 57 is arranged between the OFDM replica NCO 54 and the combining unit 46.

Figure 13:
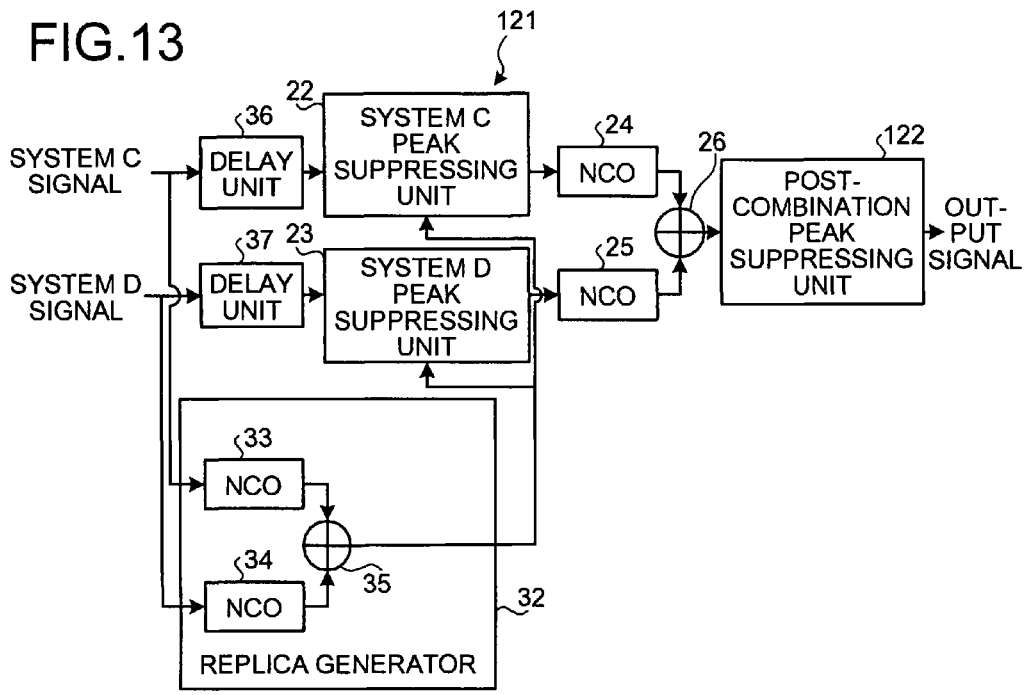
FIG. 13 is a block diagram of a peak suppressor according to a fourth embodiment of the present invention.

FIG. 13 is a block diagram of a peak suppressor according to the fourth embodiment of the present invention. As shown in FIG. 13, a peak suppressor 121 according to the fourth embodiment has a post-combination peak suppressing unit 122 added to the configuration according to the second embodiment. Other structures are the same as those in the second embodiment. The post-combination peak suppressing unit 122 further suppresses a peak of a signal output from the combining unit 26. Although not restricted in particular, the post-combination peak suppressing unit 122 has the same configuration as that of a conventional clipping mode peak suppressor (see FIG. 16), a conventional windowing function mode peak suppressor (see FIG. 17) or a conventional peak suppressor adopting any other mode. Furthermore, the fourth embodiment can be also applied to the first embodiment or the third embodiment.

In general, according to configurations where signals from respective systems are combined with each other and then peak suppression is performed, peak suppression of an input signal to a transmission amplifier can be assuredly performed. Hence, this configuration, compared to configurations where peak suppression is effected before the combining of signals from respective systems, effects alleviation of reception quality deterioration. Therefore, the configuration according to the fourth embodiment includes both the configuration where peak suppression is performed before the combination of the signals from respective systems and the configuration where peak suppression is performed after the combination of signals from the respective systems, and through consideration of a balance between suppression before combination and suppression after combination, optimization of PAPRs of signals and reception qualities of the systems is possible.

Figure 14:
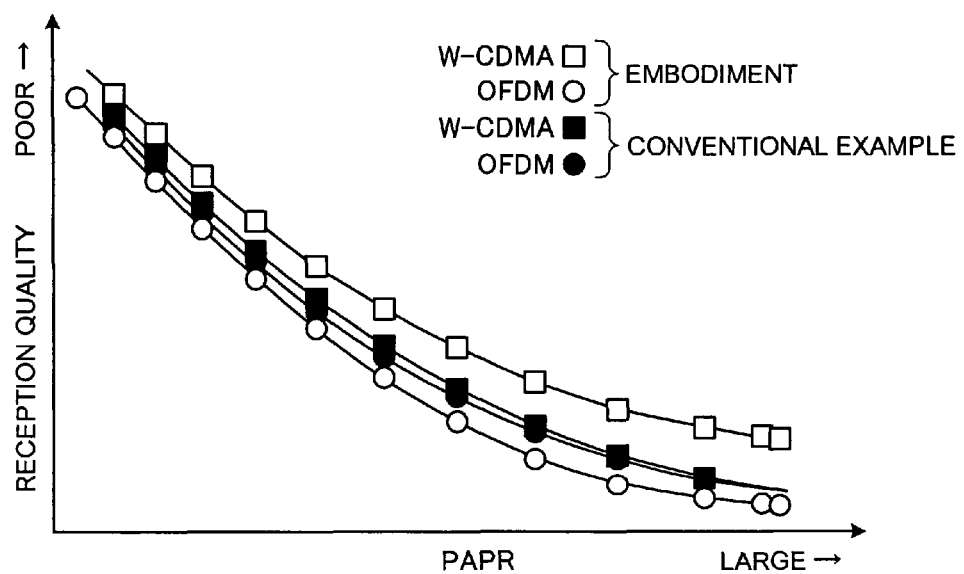
FIG. 14 is a graph illustrating the relationship between PAPR and reception quality for a specific example.
Figure 15:
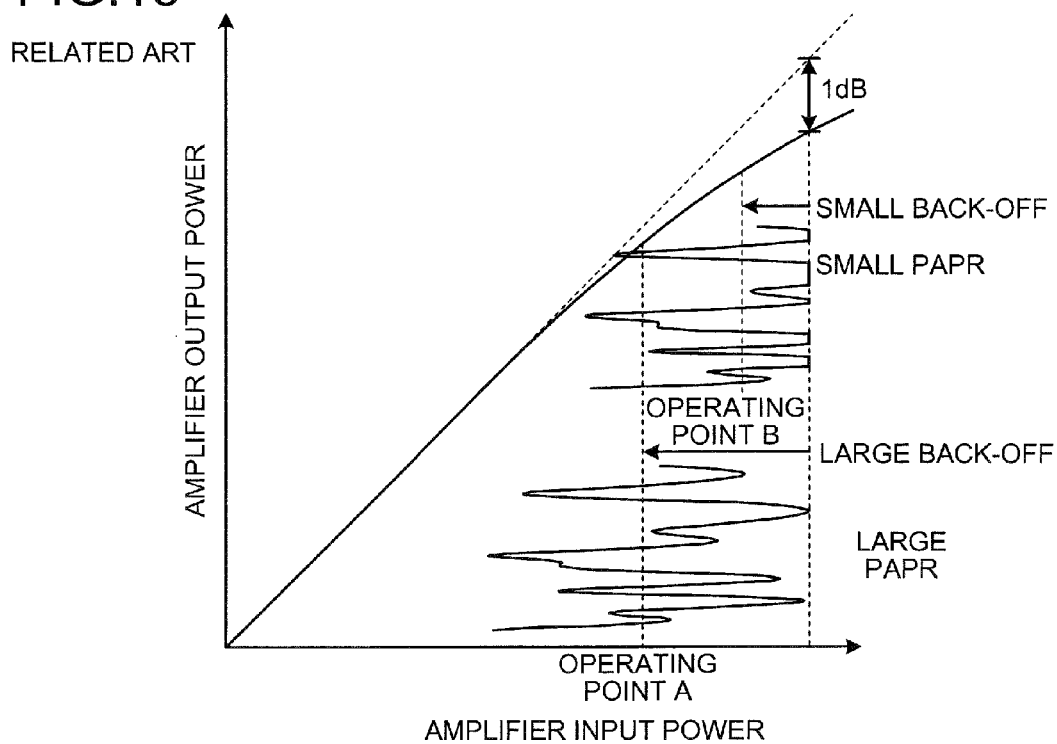
FIG. 15 is a graph illustrating the relationship between input/output characteristics of a transmission amplifier and a signal peak.

FIG. 14 is a graph illustrating the relationship between PAPR and reception quality in regard to a specific example using a peak suppressor to which the present invention is applied. Here, an embodiment to which the present invention is applied has a configuration where a post-combination peak suppressing unit having the same configuration as that in a conventional peak suppressor adopting the windowing function mode (see FIG. 17) is added to a rear stage of the combining unit 46 having the configuration depicted in FIG. 12. As shown in FIG. 14, plots of the white squares and white circles respectively represent the reception quality of a W-CDMA signal and an OFDM signal according to the embodiment, and plots of the black squares and black circles respectively represent the reception quality of a W-CDMA signal and an OFDM signal according to a conventional example.

FIG. 14 demonstrates that the reception quality deteriorates when peak suppression intensifies and the PARA decreases in both the embodiment and the conventional example. However, in the conventional example, the difference between the reception quality on the W-CDMA side and the reception quality on the OFDM side is small. On the contrary, in the embodiment, it can be understood from FIG. 14 that although deterioration in the reception quality on the W-CDMA side is allowed, the reception quality on the OFDM side is improved, attributable to compensation. Since the reception quality requirements for the OFDM signal are stricter than that for the W-CDMA signal, the combination of suppression before signal combination with suppression after signal combination is very effective.

The present invention is not restricted to any of the aforementioned embodiments, and can be modified in many ways. For example, application is not restricted to two systems having different reception quality requirements, but may be three or more.

The peak suppressor according to the present embodiments can effect an appropriate degree of peak suppression on signals of multiple systems according to different reception quality requirements specific to each system.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A peak suppressor comprising:
a plurality of peak suppressing units that perform peak suppression on a plurality of signals transmitted using different communication protocols and output a plurality of suppressed signals, wherein the peak suppression is performed based on a requirement that differs according to one of the communication protocols; and a combining unit that combines the suppressed signals, wherein the peak suppressing unit includes
an amplitude calculating unit that calculates an amplitude of a replica generated by a replica generating unit;
a suppression coefficient calculating unit that calculates a value obtained by dividing a threshold value by the amplitude;
a comparing unit that compares the amplitude with the threshold value and generates a comparison result;
a selecting unit that selects the value as a suppression coefficient when the comparison result indicates that the amplitude is larger than the threshold value, and selects a predetermined value as the suppression coefficient when the amplitude is not larger than the threshold value; and
a multiplying unit that multiplies the suppression coefficient by an original signal.

2. The peak suppressor according to claim 1, wherein the peak suppressing units include a first peak suppressing unit that performs the peak suppression on a wideband code division multiple access signal and an second peak suppressing unit that performs the peak suppression on an orthogonal frequency division multiple access signal.

3. The peak suppressor according to claim 1, further comprising a replica generating unit that generates a replica of the signals combined together before peak suppression, wherein the peak suppressing unit performs the peak suppression based on a peak position of the replica.

4. The peak suppressor according to claim 3, wherein the peak suppressing unit performs the peak suppression such that a peak value of the replica does not exceed a given value.

5. The peak suppressor according to claim 3, further comprising a delay unit that delays input of the signal to the peak suppressing unit for at least a time required to generate the replica and identify the peak position.

6. The peak suppressor according to claim 1, further comprising a post-combination peak suppressing unit that performs a peak suppression on a signal output from the combining unit.

7. A peak suppressor comprising:
a plurality of peak suppressing units that perform peak suppression on a plurality of signals transmitted using different communication protocols and output a plurality of suppressed signals, wherein the peak suppression is performed based on a requirement that differs according to one of the communication protocols; and a combining unit that combines the suppressed signals, wherein the peak suppressing unit includes
an amplitude calculating unit that calculates an amplitude of a replica generated by a replica generating unit;
a suppression coefficient calculating unit that calculates a first value obtained by subtracting from a first predetermined value a second value obtained by dividing a threshold value by the amplitude;
a comparing unit that compares the amplitude with the threshold value and generates a comparison result;
a selecting unit that selects the first value as a suppression coefficient when the comparison result indicates that the amplitude is greater than the threshold value, and selects a second predetermined value as the suppression coefficient when the amplitude is not greater than the threshold value;
a multiplying unit that multiplies the replica by the suppression coefficient and outputs a multiplied signal;
a filtering unit that removes an out-of-band component from the multiplied signal and passes a filtered signal; and
a subtracting unit that subtracts the filtered signal from an original signal.

8. A peak suppressor comprising:
at least one peak suppressing unit that performs peak suppression on a portion of a plurality of signals transmitted using different communication protocols and outputs a suppressed signal, wherein the peak suppression is performed based on a requirement that differs according to one of the communication protocols; and a combining unit that combines the suppressed signal with the signal that is not subjected to peak suppression, wherein the peak suppressing unit includes:
an amplitude calculating unit that calculates an amplitude of a replica generated by a replica generating unit;
a suppression coefficient calculating unit that calculates a value obtained by dividing a threshold value by the amplitude;
a comparing unit that compares the amplitude with the threshold value and generates a comparison result;
a selecting unit that selects the value as a suppression coefficient when the comparison result indicates that the amplitude is larger than the threshold value, and selects a predetermined value as the suppression coefficient when the amplitude is not larger than the threshold value; and
a multiplying unit that multiplies the suppression coefficient by an original signal.

9. The peak suppressor according to claim 8, including a peak suppressing unit that performs the peak suppression on a wideband code division multiple access signal, wherein an orthogonal frequency division multiple access signal is not subjected to peak suppression.

10. The peak suppressor according to claim 8, further comprising a replica generating unit that generates a replica of the signals combined together before peak suppression, wherein the peak suppressing unit performs the peak suppression based on a peak position of the replica.

11. The peak suppressor according to claim 10, wherein the peak suppressing unit performs the peak suppression such that a peak value of the replica does not exceed a given value.

12. The peak suppressor according to claim 10, further comprising a delay unit that delays input of the signal to the peak suppressing unit for at least a time required to generate the replica and identify the peak position.

13. The peak suppressor according to claim 8 further comprising a post-combination peak suppressing unit that performs a peak suppression on a signal output from the combining unit.

14. A peak suppressor comprising:
at least one peak suppressing unit that performs peak suppression on a portion of a plurality of signals transmitted using different communication protocols and outputs a suppressed signal, wherein the peak suppression is performed based on a requirement that differs according to one of the communication protocols; and a combining unit that combines the suppressed signal with the signal that is not subjected to peak suppression, wherein the peak suppressing unit includes:
an amplitude calculating unit that calculates an amplitude of a replica generated by a replica generating unit;
a suppression coefficient calculating unit that calculates a first value obtained by subtracting from a first predetermined value a second value obtained by dividing a threshold value by the amplitude;
a comparing unit that compares the amplitude with the threshold value and generates a comparison result;
a selecting unit that selects the first value as a suppression coefficient when the comparison result indicates that the amplitude is greater than the threshold value, and selects a second predetermined value as the suppression coefficient when the amplitude is not greater than the threshold value;
a multiplying unit that multiplies the replica by the suppression coefficient and outputs a multiplied signal;
a filtering unit that removes an out-of-band component from the multiplied signal and passes a filtered signal; and
a subtracting unit that subtracts the filtered signal from an original signal.

* * * * *